United States Patent
Baird

(10) Patent No.: US 6,204,787 B1
(45) Date of Patent: Mar. 20, 2001

(54) CIRCUITS AND METHODS FOR GAIN RANGING IN AN ANALOG MODULATOR AND SYSTEMS USING THE SAME

(75) Inventor: Rex Baird, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/282,840

(22) Filed: Mar. 31, 1999

(51) Int. Cl.[7] .............................. H03M 1/62; H03M 3/00
(52) U.S. Cl. ............................................. 341/139; 341/143
(58) Field of Search .................................... 341/143, 139, 341/172, 118; 327/91, 337

(56) References Cited

U.S. PATENT DOCUMENTS

| | | | |
|---|---|---|---|
| 4,107,669 | 8/1978 | Tewksbury | 341/155 |
| 4,115,809 | 9/1978 | Ueno | 358/128 |
| 4,301,446 | 11/1981 | Petit | 341/144 |
| 4,399,529 | 8/1983 | Leterme et al. | 369/110 |
| 4,588,981 | 5/1986 | Senn | 341/143 |
| 4,851,841 | 7/1989 | Scooch | 341/143 |
| 5,030,954 | * 7/1991 | Ribner | 341/172 |
| 5,363,102 | 11/1994 | Ferguson | 341/172 |
| 5,541,600 | 7/1996 | Blumenkrontz et al. | 311/139 |
| 5,703,589 | * 12/1997 | Kalthoff et al. | 341/172 |
| 5,745,060 | * 4/1998 | McCartney et al. | 341/143 |
| 5,757,299 | 5/1998 | Noro et al. | 341/143 |
| 5,892,472 | 4/1999 | Shu et al. | 341/139 |
| 6,037,887 | * 3/2000 | Wu et al. | 341/143 |
| 6,040,793 | * 3/2000 | Ferguson, Jr. et al. | 341/143 |

OTHER PUBLICATIONS

IEEE Transactions on Communications, vol. COM–33, No. 3, Mar. 1985. by Candy, pp. 249–258 "A Use of Double Integration In Sigma Delta Modulation".

* cited by examiner

*Primary Examiner*—Michael Tokar
*Assistant Examiner*—Jean B. Jeangglaude
(74) *Attorney, Agent, or Firm*—James J. Murphy; Dan A. Shifrin

(57) ABSTRACT

Analog modulator circuitry 401 includes an integrator 707. First switched capacitor circuitry 710, 711, 713, 714 selectively samples a first amount of charge from a feedback signal and couples that first amount of charge to the first and second inputs of the integrator. Second switched capacitor circuitry 711, 714, 716, 717 selectively samples a second amount of charge from the feedback signal and couples that second amount of charge to the first and second inputs of the integrator stage to selectively compensate for an offset of an input signal to the integrator with respect to a reference voltage.

20 Claims, 4 Drawing Sheets

CIRCUITS AND METHODS FOR GAIN RANGING IN AN ANALOG MODULATOR AND SYSTEMS USING THE SAME

CROSS-REFERENCE TO RELATED APPLICATION

The following co-pending and co-assigned application contains related information and is hereby incorporated by reference: Ser. No. 08/956,569 (Attorney Docket No. 0746-MS), entitled "SYSTEMS AND METHOD FOR CONTROL OF LOW FREQUENCY INPUT LEVELS TO AN AMPLIFIER AND COMPENSATION OF INPUT OFFSETS OF THE AMPLIFIER" filed Oct. 23, 1999;

Ser. No. 09/282,121 (Attorney Docket No. 0926-MS [2836-P083US]), entitled "CIRCUITS AND METHODS FOR EXCHANGING SIGNALS IN OPTICAL DISK SYSTEMS AND SYSTEMS USING THE SAME", filed Mar. 31, 1999;

Ser. No. 09/282,841 (Attorney Docket No. 0951-MS [2836-P090US]), entitled "A FLEXIBLE INTERFACE SIGNAL FOR USE IN AN OPTICAL DISK SYSTEM AND SYSTEMS AND METHODS USING THE SAME", filed Mar. 31, 1999; and Ser. No. 09/282,849 (Attorney Docket No. 0-MS [2836-P091US]), entitled "SERVO CONTROL LOOPS UTILIZING DELTA-SIGMA ANALOG TO DIGITAL CONVERTERS AND SYSTEMS AND METHODS USING THE SAME" filed Mar. 31, 1999.

BACKGROUND OF THE INVENTION

1. Field of the Invention

The present invention relates in general to analog modulators and in particular, to circuits and methods for gain ranging in an analog modulator and systems using the same.

2. Description of the Related Art

Optical disks have been used for many years for the mass storage of digital data. Some well known examples of optical disks include digital audio compact disks (CD-DAs), compact disk read-only memories (CD-ROMs) and digital video or digital versatile disks (DVD-ROMs). Essentially, digital data is stored on a plastic disk as a series of pits in the disk surface. During playback, a beam of light is directed to the rotating disk surface and the intensity of the photons reflected from the pits measured. A modulated electrical signal is generated that can be processed and the data stored on the disk recovered.

A basic configuration for the read (playback) mechanism has developed over a number of years. This configuration includes a pickup or sled which is movable so that a laser, a lens, and array of photodiodes can be positioned directly over the data being read off of the disk. As the disk turns, the photons from the laser are reflected off the pits and lands received by the photodiodes which generate electrical signals having a current that is proportional to photon density.

The multiple signals output from the photodiodes represent both data detection and servo alignment information. The summation of the high speed data channel signal, which may be composed of the signals A+B+C+D from an astigmatic photodiode array, results in a composite signal with relevant information between approximately 10 KHz and 60 MHz for current DVD players. Servo information contained in these signals however, is at frequencies less than 1 MHz (for current spindle rotation rates of <6000 RPM). Because of these information rates, the data channel signal is sometimes AC-coupled to the data detection and summation circuitry mounted on an accompanying stationary circuit board. Otherwise, some degradation of the dynamic range must be accepted due to the dc content of the incoming signal.

The typical current signal generated by a photodiode is on the order of 1 $\mu$A. Transferring this signal directly down a flexible cable to the stationary circuit board therefore would seriously degrade the signal to noise ratio. Hence, transimpedance amplifiers, which convert the current from the photodiode array into a voltage for driving the cable, are mounted in the pickup to boost the signal and minimize noise and interference effects. The data detection, error correction, and servo systems are kept off of the pickup not only because of the same interference reasons, but also to reduce the physical size and mass of the sled. These systems are mostly digital, and switching noise on the pickup may degrade the signal to noise ratio of the diode signal.

Depending on the manner in which the photodiodes and transimpediance amplifiers are configured, the dc offset of the signal passed to the flex cable can differ with respect to the system reference voltage. As a result, the front-end processing integrated circuits (IC) must typically be customized to operate with a specific type of pickup configuration. Flexibility is lost, as different chip versions must be designed and produced as a function of the corresponding pickup.

Thus, a need has arisen for circuits and methods which allow an integrated circuit operating in an optical disk system to be compatible with multiple pickup configurations.

SUMMARY OF THE INVENTION

According to the principles of the present invention, analog modulator circuitry is disclosed which includes an integrator having first and second inputs. First switch capacitor circuitry selectively samples a first amount of charge from a feedback signal and couples that first amount of charge to the first and second inputs of the integrator stage. Second switch capacitor circuitry selectively samples a second amount of charge from the feedback signal and couples that second amount of charge to the first and second inputs of the integrator to selectively compensate for an offset of an input signal to the integrator stage with respect to a reference voltage.

The present inventive principles allow for the construction of circuits and systems which are capable of operating with a different optical disk pickup configurations. A need for customizing chips for each separate type of pickup is no longer required since the end user need only set bit to allow the circuitry to compensate for the corresponding different input signals.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIG. 1–8 of the drawings, in which like numbers designate like parts.

Figure 1:
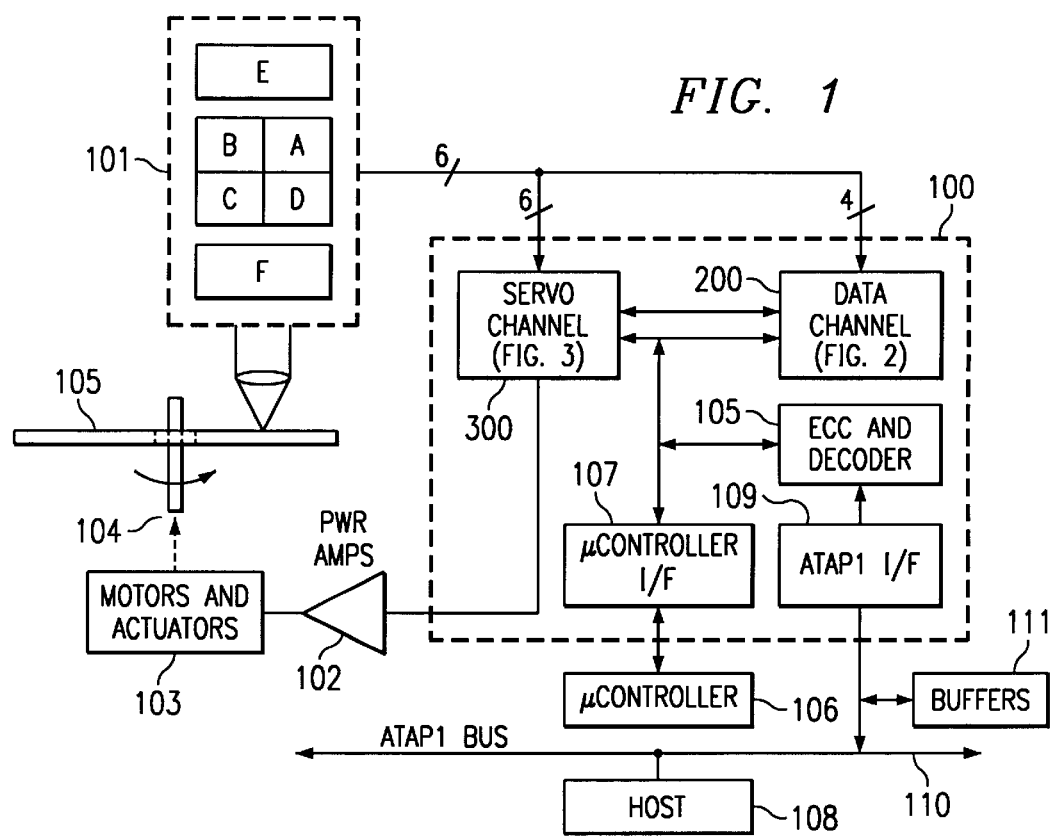
FIG. 1 is a conceptual diagram of an exemplary personal computer based optical disk playback system.

FIG. 1 is a conceptual diagram of an exemplary personal computer (PC) based optical disk playback system including a drive manager integrated circuit(IC or "chip") 100 embodying the present inventive concepts. It should be recognized however that IC 100 can also be used with CD or DVD players and DVD RAM systems. In addition to chip 100, the system also includes optical pickup 101, including the requisite laser, photodiode array and transimpedance amplifiers, and the power amplifiers 102 and motors & actuators 103 which control the player spindle 104 rotation and pickup 101 movement and alignment. In the preferred embodiment, drive manager chip 100 embodies decoding circuitry for processing data from either DVD-ROM, CD-ROM or CD-DA optical disks.

There are two principal processing paths, one each for the servo and data channels, the inputs of which are driven by the transimpedance amplifiers on optical pickup 101. The servo path is shown generally at 300 and the data path generally at 200. Each of these paths will be discussed in further detail below in conjunction with FIGS. 3 and 2 respectively. The output of the data channel is passed through ECC and Decoder 105 for additional processing such as error correction and decoding the block code.

Local control is implemented by microcontroller 106 through microcontroller interface 107. Typically, local microcontroller 106 is user supplied for maximum flexibility and generally provides the instructions directing the on-board processors and error correction circuitry.

Chip 100 additionally communicates with a host processor 108 via an ATAPI bus interface 109 and ATAPI bus 110, in the case of a PC-based system. The host performs the actual processing of the audio/video information or data retrieved from the disk after error correction and buffering by chip 100. Among other things, the host performs audio and video MPEG decoding and generates the corresponding user interface. Buffers (DRAM) 111 support error correction functions and the streaming of data from chip 100 to host 108.

Figure 2:
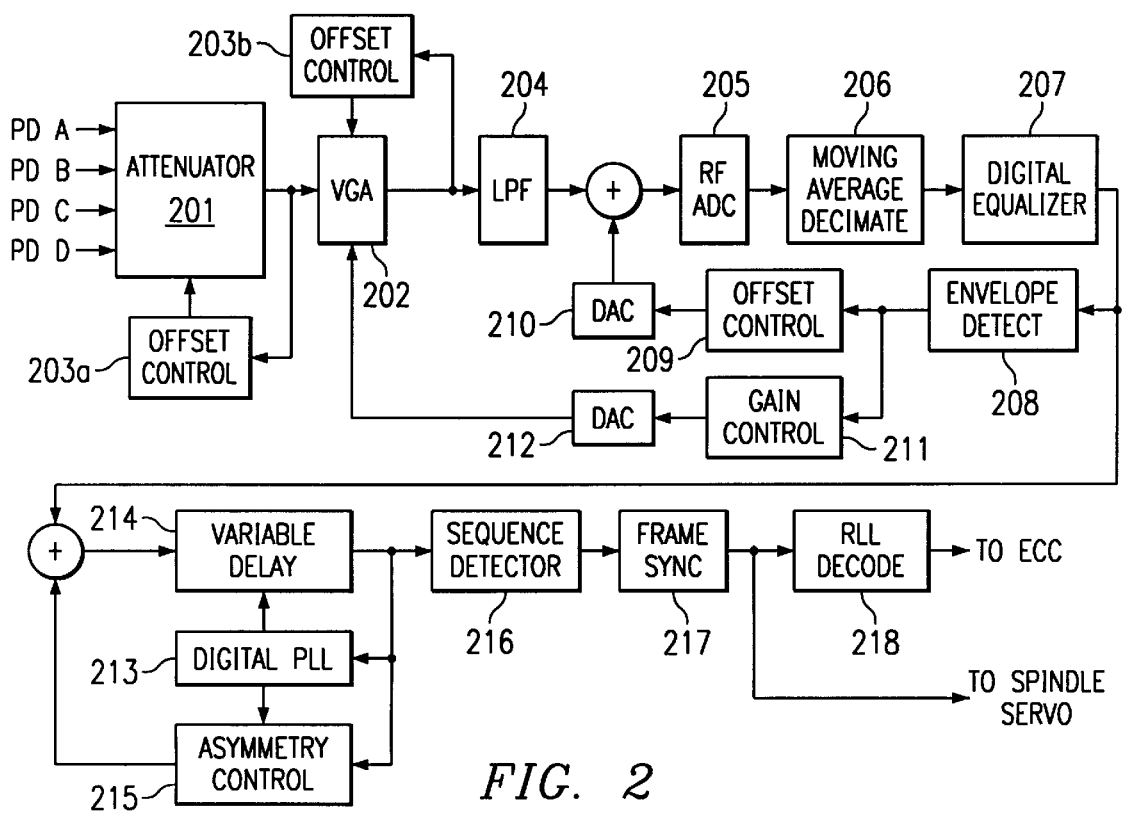
FIG. 2 is a detailed functional block diagram of the data path shown in FIG. 1.

Referring to FIG. 2 which is a detailed functional block diagram of data path 200, attenuators 201 are used in the preferred embodiment to protect the inputs to following VGAs from damage from any over-voltages produced by the pickup. Offset controls 203a and 203b allow the digital offset control loop discussed below to respond to dc and low frequency offsets in transimpedance amplifiers, diodes, attenuators 201 and VGAs 202.

Data channel summation and variable gain amplifier (VGA) circuitry 202 add one or more signals from the transimpedance amplifiers on pickup 101 to form a composite data signal (e.g., A+B+C+D). Alternatively, the signal addition may be done right on pickup 101, either electrically or optically. The VGA gain is controlled by automatic gain control loops, also discussed below.

A low pass filter (LPF) 204 provides anti-aliasing for flash analog to digital converters 205. A digital moving average of the output of ADCs 205 is taken and filter 206 is applied to reject noise and interference in the Nyquist bandwidth, as well as perform a decimation. It should be noted that any one of a number of other types of filters can be used to achieve the same result. The decimating filter 206 can also be used to lower the effective sampling rate of the data for subsequent digital data processing.

The data is then digitally equalized using a multiple-tap finite impulse response (FIR) filter 207 adjustable to differing data rates and disk resolutions. Advantageously, the front-end analog circuits are simplified since data is immediately digitized and the necessary equalization is performed digitally.

Automatic offset control is effectuated by the loop including envelope detectors 208, offset controls 209 and DACs 210. Envelope detectors 208 detect both the top and bottom envelopes of the high speed data signal. These envelopes are summed to produce an error signal which is passed through an offset loop compensation filter within offset control block 209 and integrated. The output of the loop compensation filter is converted to analog form by DACs 210 and summed with the output of LPF 204.

Gain control loop 211 also takes the difference between the amplitudes of top and bottom detected envelopes and subtracts a pre-programmed gain value. A gain loop compensation filter integrates the results and produces a linearized signal which is converted by DACs 212 to analog form and passed to VGAs 202 to adjust the signal gain.

An interpolating digital phased-locked loop (DPLL)213 retimes the data after ADC sampling and digital equalization. DPLL 213 operates on sampled amplitudes and generally includes a digital phase error detector, digital loop compensation filter, and digital frequency to phase integrator (digital VCO). Variable delay filter 214 interpolates the asynchronous digital samples to ideal synchronously sampled samples at the front of the DPLL. The phase detector then generates an error signal using a stochastic process which compares the incoming data with ideal target sampling values without noise. The error signal is multiplied by the derivative of the target data to produce phase error estimates. The loop compensation filter performs a proportional integration and the result is sent to variable delay filter 214 to adjust the delay and correct for phase errors.

Advantageously, digital PLL 213 allows the ADC and equalizer to operate at a fixed asynchronous sample rate to the data.

Asymmetry control circuitry 215 includes a control loop which corrects the read errors from the optical pickup. The errors are detected using either the slicer duty cycle or zero crossing errors. The errors are then scaled and integrated by a compensation filter and the resulting compensation signal summed at the input to variable delay filter 214.

The retimed data is then processed by a maximum likelihood sequence detector 216. The partial response equalization target assumed in this detector is $G(D)=1+D+D^2+D^3$. At a bit error rate of 1E-6 the sequence detector achieves a 6 dB SNR advantage over slicer-based detection. This performance level allows the error correction circuitry and decoder to focus on burst errors caused by disc defects, rather than on random errors.

The output of sequencer 216 is synchronized by frame synchronization circuitry 217 and then passed to RLL decoder 218. RLL code embedded in the disk is used as an indication of disk defects. Generally, a state machine checks for violation of the RLL code "k-constraint" and failures in synchronization and then causes the data channel to "coast" through the defect and then resynchronizes the data stream.

Automatic Zone Control (AZC) logic (not shown) takes advantage of the digital nature of the data channel by initializing subsystems based on data rate. For example, the tap weights and tap spacing of the digital equalizer are set to correspond to one of six incoming data rates. Similarly, the loop coefficients, and hence the loop dynamics, of interpolating digital PLL 213 are controlled by the AZC logic.

In sum, the data channel is a bandpass system with signals in the 10 kHz to 60 MHz range. The signal spectrum below 10 kHz is either servo information or external dc offsets from the pickup electronics. The presence of this information reduces the dynamic range and bandwidth of the data channel. Using an off-chip ac coupling capacitor would reduce the dc offset but block the low frequency servo information. Instead, the dc signal is brought on-chip and a control loop performs the effective ac coupling for the data channel. Not only are external coupling capacitors unnecessary, but defect detection by the downstream digital processing can freeze this control loop when a defect is reached, unlike an ac coupled system where the baseline wanders. The offset and AGC loops are also frozen until data transitions are detected. Co-pending and co-assigned application Ser. No. 08/956,569 (Attorney Docket No. 0746-MS), entitled "SYSTEM AND METHOD FOR CONTROL OF LOW FREQUENCY INPUT LEVELS TO AN AMPLIFIER AND COMPENSATION OF INPUT OFFSETS OF THE AMPLIFIER" filed Oct. 23,1997 contains related information.

Decoder block 105 (FIG. 1) manages the flow of data between the data channel and external DRAM buffer 111 and manages PC host ATAPI interface 109. The ECC circuitry performs realtime ECC correction for DVD data and layered ECC correction for CD-ROM data. Additionally 8–14 demodulation is provided for DVD data and EFM demodulation for error correction and deleaving of CD-DA and CD-ROM data. A burst cutting area (BCA) decoder is built-in chip 100 for DVD-ROM applications. DVD Navigation Play for DVD player operations is supported along with CSS circuitry for descrambling DVD data which has been scrambled under the Content Scramble System. The error correction and decoding functions are supported by on-chip SRAM.

Figure 3:
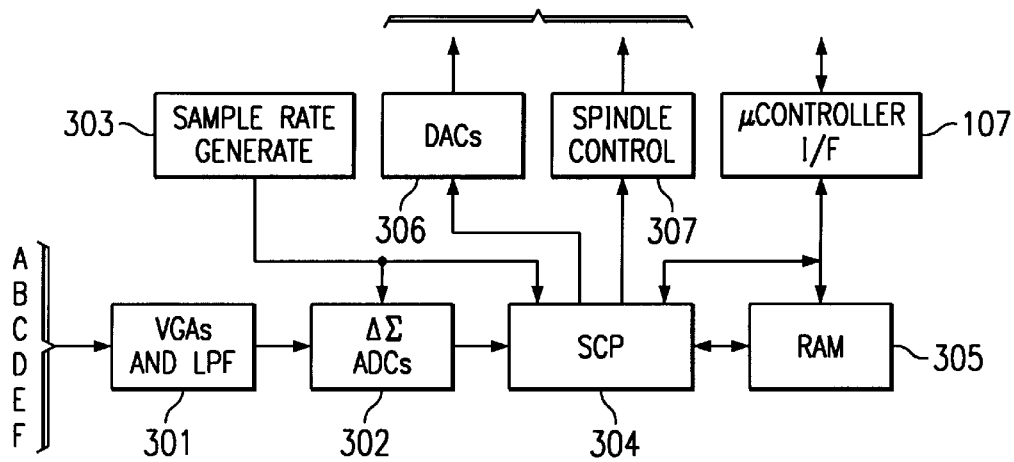
FIG. 3 is a diagram showing further detail of the servo control path shown in FIG. 1.

As indicated above, the second principal signal path of the chip 100 controls servo operation and is shown generally at 300 in FIG. 1 and in further detail in FIG. 3. The integrated servo system operates four control loops: focus, tracking, sled, and spindle, using an internal servo control processor requiring little external microcontroller intervention.

Servo data is received from each of the six photodiodes 101 and then amplified by six VGAs 301. As a result, the following ADCs 302 only require 60 dB of dynamic range, because servo VGAs 301 boost the input signal by as much as 28 dB. VGAs 301 also incorporate low pass filtering (LPF) for anti-aliasing. Preferably three pole filters are used with one pole in front of the VGAs and two poles after the VGAs.

Analog to digital conversion is done immediately after low pass filtering such that the analog/digital boundary is as close to the input as possible. An input sampling frequency of 24 MHz (generated on-chip by sample rate generator 303, input signal is sampled at 24 MHz, data samples produced for digital filtering at 12 MHz) and a third order delta-sigma modulator reduce digital filter group delay inside the servo loop.

Servo data processing is performed by on-board servo control processor (SCP) 304, which receives its instruction set from the user selected local microcontroller 106 through interface 107 and RAM 305.

Unlike CD systems, DVD servo systems use differential phase detection (DPD) between the photodiode signals D1,D2 (D1=A+C, D2=B+D) for track following and track counting. A digitally intensive adaptive dual arm correlator (ADAC) implemented. This is superior to the conventional DPD methods based on a simple phase detector and analog filters.

Analog control signals are transmitted to power amplifiers 102 through DAC array 306 and spindle controls 307.

Figure 4A:
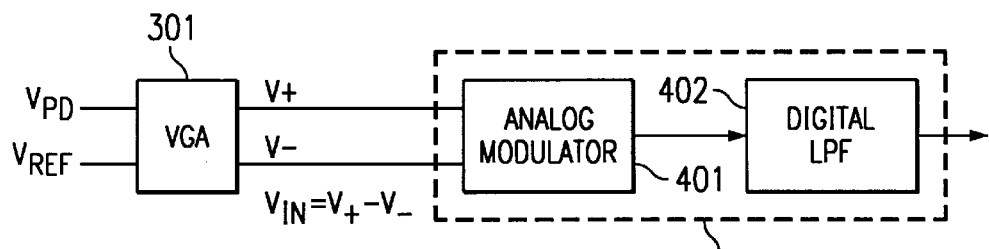
FIG. 4A is a diagram of the front end of the servo path shown in FIG. 1.

FIG. 4A is a diagram emphasizing the front end of the path taken by the photodiode outputs for the servo path. Data are received from the transimpedance amplifiers in differential form as $V_{PD}$ and $V_{REF}$ and amplified to produce the ADC input signals of V+ and V−. Delta-sigma converters 302 include an analog ($\Delta\Sigma$) modulator 401 and digital low pass filter 402.

Figure 4B:
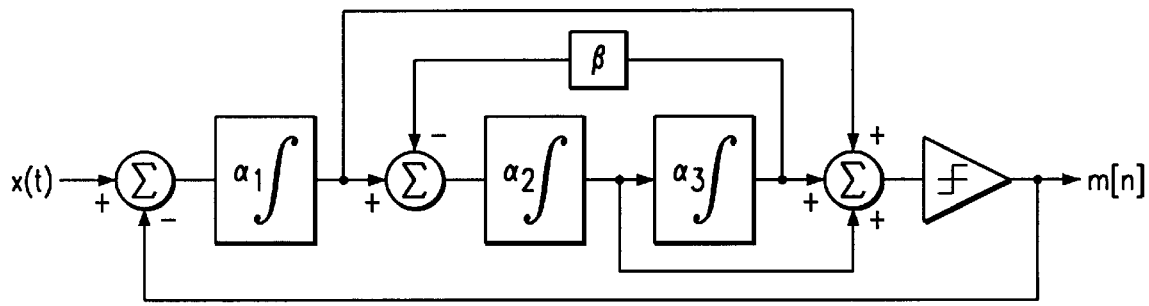
FIG. 4B is a conceptual diagram of a third order analog modulator.

A conceptual diagram of a third order analog modulator is shown in FIG. 4B. In a third order modulator, data is passed through three integration stages and then converted in to 1-bit digital form by a 1-bit analog to digital converter (ADC). It should be noted that multiple-bits could also be used. The digital signal is passed on for filtering. The output is also reconverted to analog form and provided as negative feedback to the input of each integration stage.

Analog modulator 401 samples between V+ and V− such that the input voltage $V_{IN} \approx (V+)-(V-)$. More particularly, the data are converted at the high speed sampling frequency Fs into a stream of 1-bit data representing the bandwidth limited input signal. This process also adds quantization noise.

Low pass filter 402 removes the quantization noise and produces a multibit digital output from the 1-bit output of modulator 401. The data are also decimated to decrease the sample frequency.

Figure 5A:
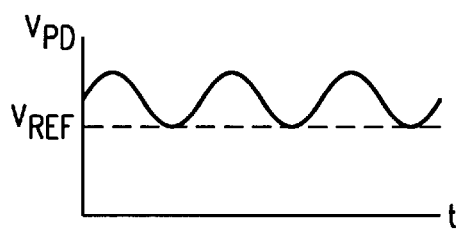
FIGS. 5A–5C illustrate exemplary relationships between the input signal to the front end circuitry of FIG. 4A and a reference voltage.
Figure 5B:
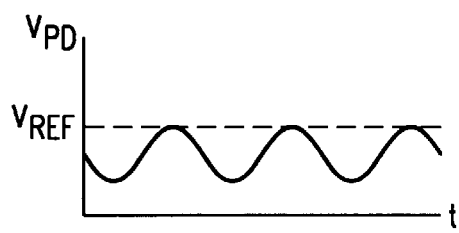
Figure 5C:
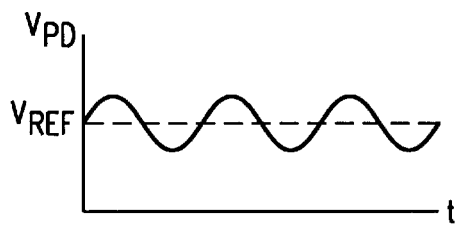

As already mentioned, different photodiode configurations in the pickup produce different output signals, whether system is operating on either single-ended or differential data. As shown in FIGS. 5A and 5B, the output from the transimpedance amplifiers on the pickup can either generate a peak-to-peak voltage swing between the reference voltage and the full amplifier output voltage $V_{MAX}$ or a peak-to-peak swing between the reference voltage and a low amplitude voltage $V_{MIN}$. Circuitry can also be added to the pickup to provide offsets to center the signal around the voltage reference, as is shown in FIG. 5C.

Figure 6A:
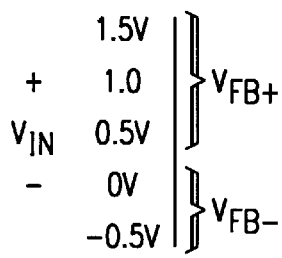
FIGS. 6A–6C illustrate the desired feedback levels for the cases when the input signal is centered above, below and centered about the reference signal.
Figure 6B:
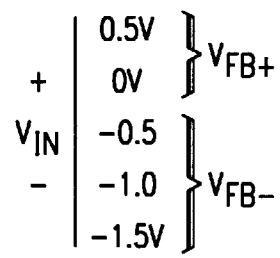
Figure 6C:
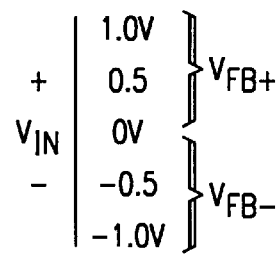

A 1-bit delta-sigma modulator such as modulator 401 uses only two feedback levels, $V_{FB}+$ and $V_{FB}-$. To use the full voltage range of the ADC, therefore the input signal should be centered in the feedback dynamic range, otherwise conversion resolution is lost. FIGS. 6A–6C show the desired feedback for the cases when $V_{IN}$ is above (6A), below (6B) and centered about (6C) $V_{REF}$ (when $V_{PD}=V_{REF}$, $V_{IN}=V+-V-=0$).

According to the principles of the present invention, the input stage to delta-sigma modulators 401 are modified such that they can handle each of the three different possible input conditions. The inputs are normally centered about $V_{REF}$ for the bipolar voltage swing of FIG. 6C. The conditions in FIGS. 6A and 6B can be made identical by inverting the input signal in the case shown in FIG. 6B and compensating for the inversion in local SCP 304. Charge is either added to or cancelled from the integration capacitors Ci of the first integrator in the delta-sigma modulator to offset the input signals with respect to the reference voltage.

Figure 8:
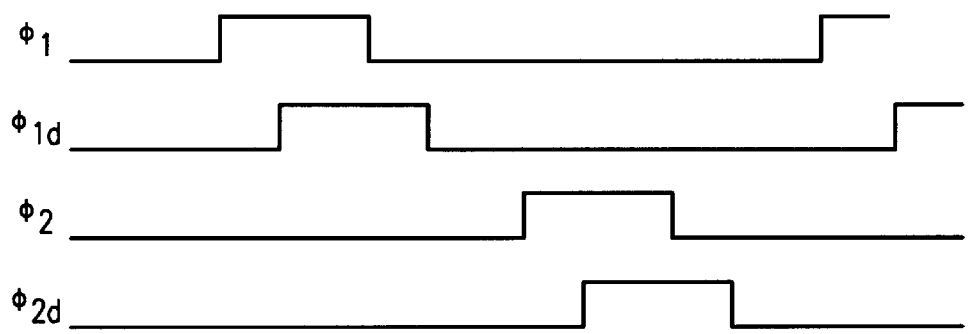
FIG. 8 is a timing diagram showing the relationships between the nonoverlapping clocks used during the operation of the circuitry of FIGS. 7A and 7B.
Figure 7A:
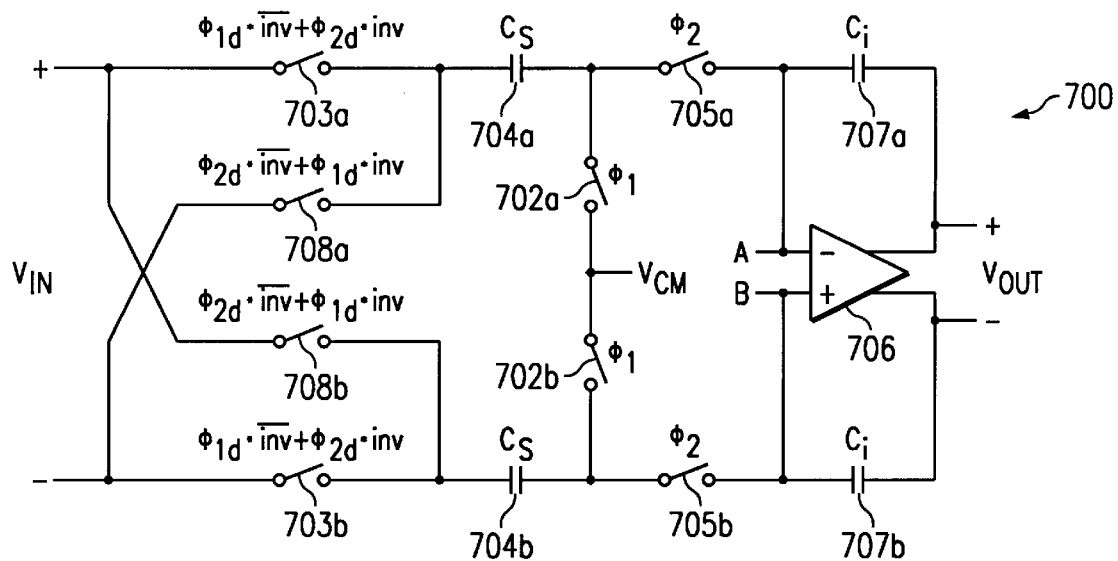
FIG. 7A is a diagram of an integrator stage of an analog modulator.
Figure 7B:
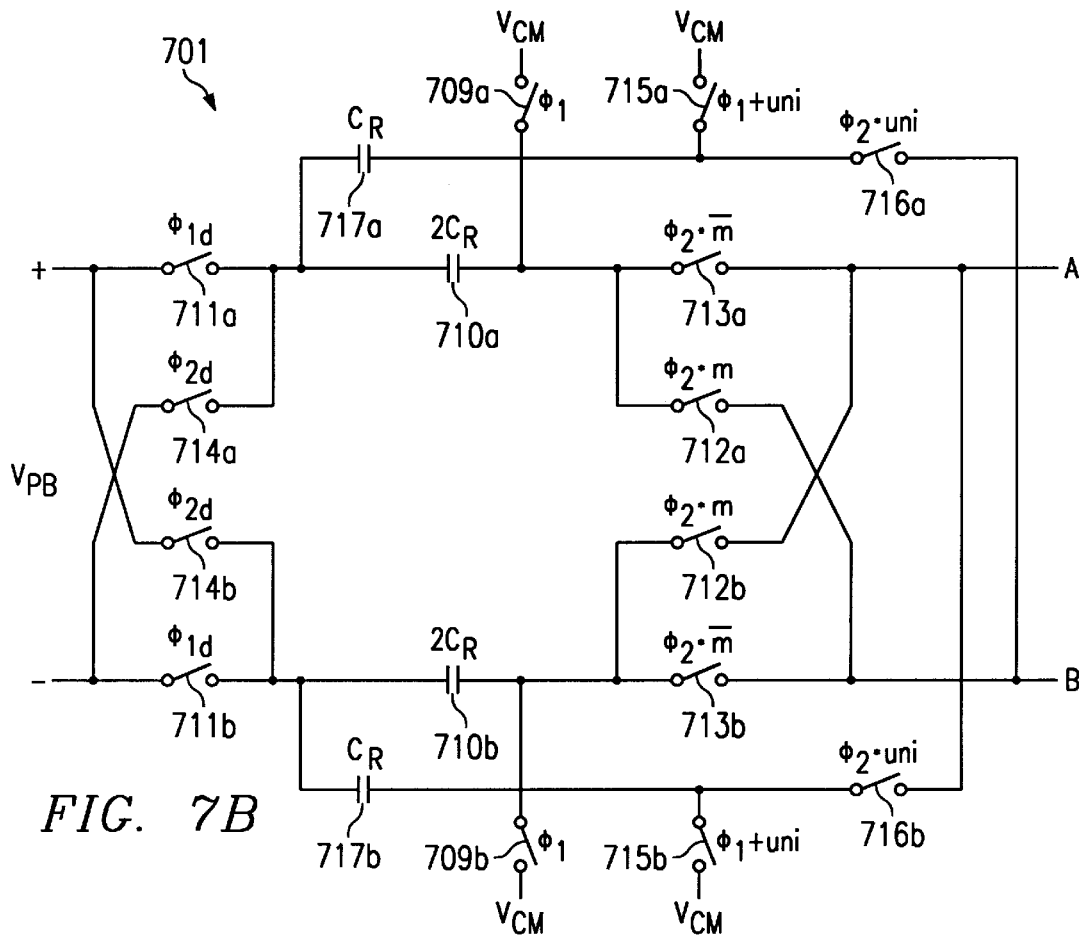
FIG. 7B is a diagram of a feedback input for the integrator stage of FIG. 7A.

FIG. 7A is a schematic diagram of the integrator portion 700 in the first stage of an exemplary delta-sigma modulator, such as modulator 401. Feedback circuitry 701 embodying the principles of the present invention and suitable for use in a delta-sigma modulator in conjunction with integrator 700 is depicted in FIG. 7B. For purposes of the following discussion of these FIGURES, the following signals are defined:

inv=0 positive input voltage
inv=1 negative input voltage
uni=0 bipolar swing ($V_{PD}$ centered about $V_{REF}$)
uni=1 unipolar swing ($V_{PD}$ above or below $V_{REF}$)
m=0 negative 1-bit modulator output
m=1 positive 1-bit modulator output
$\phi_1$, $\phi_2$ two phase non-overlapping clocks (FIG. 8)
$\phi_{1D}$, $\phi_{2D}$ delayed signals from $\phi_1$ and $\phi_2$ (FIG. 8)

The circuitry of FIG. 7A can now be described by assuming the case where the input voltage $V_{IN}$ is positive and inv=0. During $\phi_1$ active, switches 702a and 702b close such that during $\phi_{1D}$ active, when switches 703a and 703b close, sampling capacitor (Cs) 704a is charged to a positive voltage and sampling capacitor (Cs) 704b is charged to a negative voltage relative to the common mode voltage $V_{CM}$. $\phi_1$ then transitions inactive and sampling capacitors Cs are disconnected.

When $\phi_2$ transitions active, capacitors 704 are coupled by switches 705a and 705b to the inverting and non-inverting inputs of operational amplifier 706 and to integration capacitors (Ci)707a and 707b. Then, when $\phi_{2D}$ transitions active, switches 708a and 708b close. The charge on sampling capacitors 704 is transferred to the integration capacitors 707. It should be noted that operational amplifier 706 and integration capacitor 707 will hereinafter be described as the "integrator stage".

A similar sequence of events occurs when the input is negative, (i.e. inv=1), only the polarities are reversed.

The illustrated embodiment 701 of a delta-sigma ADC feedback loop can now be described in conjunction with FIG. 7B. For discussion purposes, assume that the 1-bit data out of the analog modulator is high (m=1). In the first case (FIG. 6C), the input signal is centered about VREF and consequently, uni=0.

During $\phi_1$ active, switches 709a 709b close so that capacitors (2$C_R$) 710a and 710b charge during $\phi_{1d}$ active as switches 711a and 711b close. In the present case where m=1, when $\phi_2$ transitions active, switches 712a and 712b close and the inverted feedback signal is sent to the front-end integrator 700. (If m=0, then switches 713a and 713b close and the non-inverted feedback signal is sent instead). The charge on capacitors (2$C_R$) 710 is forced to the outputs A and B during $\phi_{2d}$ active when switches 714a and 714b close.

In the event that either of the cases described in FIGS. 6A or 6B arise, feedback circuitry 701 operates as described above, but in this case the signal uni is set to 1. During $\phi_{1d}$ active, capacitors ($C_R$) 717a and 717b are charged to the input voltage in parallel with capacitors 710a and 710b through switches 711 and 715. Preferably, capacitors 717 are half the size of capacitors 710 and therefore make the total capacitance in each of the two paths 50% larger. Then, during $\phi_{2d}$ active, capacitors ($C_R$) are cross-coupled to the outputs A and B through switches 716a and 716b. Depending on the value of m, charge on Cr adds constructively or destructively with charge on 2Cr when the charge is forced onto the intigration capacitors (Ci) 707 of FIG. 7A to which each 2Cr-Cr capacitor pair is ultimately coupled. For example, when m=1 the charge on capacitors 717 boost the charge injected on the integration capacitors 707 by an additional 50% when the appropriate switch conditions are met. When m=0 the charge on capacitors 717 reduce the charge injected on capacitors 707 by 50% when the appropriate switch conditions are met. Generally common mode voltages at the opamp inputs and outputs will readjust to maintain balanced voltages in the differential system. The additional capacitance provided by capacitors Cr in any event change the charge sharing with the capacitors Ci such that the input signal is offset up or down with respect to the reference.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. Analog modulator circuitry comprising:
    an integrator having first and second inputs;
    first switched-capacitor circuitry for selectively sampling a first amount of charge from a feedback signal to first and second feedback capacitors during a first timing phase and coupling said first amount of charge from said first and second feedback capacitors to said first and second inputs of said integrator stage during a second timing phase;
    second switched-capacitor circuitry for selectively sampling a second amount of charge from said feedback signal to third and fourth capacitors in parallel with said first and second capacitors during said first timing phase and coupling said second amount of charge from said third and fourth capacitors during said second timing phase to said first and second inputs of said integrator stage to selectively compensate for an offset of an input signal to said integrator stage with respect to a reference voltage; and
    switching circuitry for selectively cross-coupling said third and fourth capacitors with said inputs of said integrator.

2. The analog modulator of claim 1 wherein said first switched-capacitor circuitry further comprises circuitry for selectively cross-coupling said first amount of charge to said inputs of said integrator stage.

3. The analog modulator circuitry of claim 1 wherein said first and second capacitors have a first selected capacitance and said third and fourth capacitors have a second selected capacitance.

4. The analog modulator of claim 3 wherein said second capacitance is approximately one-half of said first capacitance.

5. An analog modulator comprising:
   an integrator including an integrator stage having inverting and non-inverting inputs; and
   feedback circuitry comprising:
      first switched-capacitor circuitry for sampling a feedback signal to charge first and second feedback sampling capacitors during a first timing phase and selectively coupling the charge on the first and second feedback sampling capacitors to the inputs of the integrator stage during a second timing phase; and
      second switched-capacitor circuitry activated as a function of a relationship between an input signal to the modulator and a reference signal for sampling the feedback signal to charge third and fourth feedback sampling capacitors during the first phase and selectively coupling the charge from the third and fourth capacitors to the inputs of the integrator stage during the second phase.

6. The analog modulator of claim 5 wherein the integrator includes switched-capacitor circuitry for sampling an input signal during the first timing phase to charge the first and second sampling capacitors and coupling the charge on the first sampling capacitor to the inverting input and the charge on the second sampling capacitor to non-inverting input of the integrator stage during the second timing phase.

7. The analog modulator of claim 5 wherein the feedback signal is received at first and second differential inputs and the first switched-capacitor circuitry includes switches for selectively switching the first and second sampling capacitors between the first and second outputs.

8. The analog modulator of claim 7 wherein the first switched-capacitor circuitry includes switches for selectively switching the first and second capacitors between the inverting and non-inverting inputs of the integrator stage in response to a modulator output signal.

9. The analog modulator of claim 5 wherein the feedback signal is received at first and second differential inputs and the second switched-capacitor circuitry includes switches for selectively coupling the first and second inputs to the third and fourth capacitors.

10. The analog modulator circuitry of claim 9 wherein the second switched-capacitor circuitry includes a first switch for selectively coupling the third capacitor to the inverting input and a second switch for selectively coupling the fourth capacitor to the non-inverting input of the integrator stage.

11. The analog modulator of claim 5 wherein the third and fourth capacitors have a smaller capacitance than the first and second capacitors.

12. The analog modulator of claim 11 wherein the third and fourth capacitors have a capacitance approximately one-half of the capacitance of the third and fourth capacitors.

13. A method for centering an input signal having a predetermined relationship with a reference voltage in the dynamic range of an analog modulator comprising the steps of:
   selectively charging first and second capacitors by sampling a modulator feedback signal;
   coupling the charge on the first and second capacitors to the capacitors of an analog integrator stage;
   selectively charging third and fourth capacitors by sampling the modulator feedback signal, the third and fourth capacitors having capacitances less than the capacitances of the first and second capacitors; and
   selectively coupling the charge on the third and fourth capacitors to the integrator stage to selectively add or subtract charge from the charge contributed by the first and second capacitors.

14. The method of claim 13 and wherein the first and second capacitors have approximately one-half of the capacitance of the first and second capacitors.

15. The method of claim 13 and further comprising the steps of:
   selectively charging fifth and six capacitors by sampling the input signal; and
   selectively coupling the charge on the fifth and sixth capacitors to the integration capacitors of the integrator.

16. The method of claim 13 wherein the input signal is above the reference voltage and the step of selectively coupling charge from the third and fourth capacitors comprises the step of translating downward the input signal to be centered approximately about the reference signal.

17. The method of claim 16 wherein the input signal is below the reference voltage and said method further comprises the step of inverting the input signal.

18. A processing device having a delta-sigma modulator operable to center a received input signal approximately about a reference voltage comprising:
   at least one integrator including an analog integrator stage and feedback circuitry, said feedback circuitry comprising:
      circuitry for selectively sampling a first amount of charge from a feedback signal to first and second capacitors and for selectively coupling said first amount of charge from said first and second capacitors to first and second inputs of said integrator stage; and
      circuitry for selectively sampling a second amount of charge from said feedback signal to third and fourth capacitors and coupling said second amount of charge from said third and fourth to said first and second inputs of said integrator stage to selectively add and subtract said second amount of charge from said first amount of charge.

19. The processing device of claim 18 wherein said analog modulator forms a part of a delta-sigma analog to digital converter.

20. The processing device of claim 18 wherein said processing device comprises an optical disk manager integrated circuit.

* * * * *